United States Patent [19]
Ko et al.

[11] Patent Number: 6,028,496
[45] Date of Patent: Feb. 22, 2000

[54] ACTIVE INDUCTOR

[75] Inventors: Jin-Su Ko, Suwon; Kwyro Lee, Taejeon, both of Rep. of Korea

[73] Assignee: Samsung Electronics Co., Ltd., Rep. of Korea

[21] Appl. No.: 09/090,047

[22] Filed: Jun. 3, 1998

[30] Foreign Application Priority Data

Dec. 8, 1997 [KR] Rep. of Korea .................. 97-66763

[51] Int. Cl.$^7$ ............................................. H03H 11/40
[52] U.S. Cl. ............................................. 333/214; 330/85
[58] Field of Search ................................. 333/214, 215; 330/85, 311

[56] References Cited

U.S. PATENT DOCUMENTS

| 5,202,655 | 4/1993 | Hara ........................................ 333/215 |
| 5,726,613 | 3/1998 | Hayashi et al. ......................... 333/214 |

OTHER PUBLICATIONS

Hara, "Lossless Broad–Band Monolithic Microwave Active Inductors," *IEEE Transactions on Microwave Theory and Techniques*, 37:1979–1984 (Dec. 1989).

Ko et al., "Lower power, tunable active inductor and its applications to monolithic VCO and BPF," *IEEE MTT–S Digest*, 929–932 (Jun. 8, 1997).

Lucyszyn et al., "Monolithic Narrow–Band Filter Using Ultrahigh–Q Tunable Active Inductors," *IEEE Transactions on Microwave Theory and Techniques*, 42:2617–2622 (1994).

Robertson et al., "Ultrawideband Biasing of MMIC Distributed Amplifiers Using Improved Active Load," *Electronics Letters*, 27:1907–1909 (1991).

*Primary Examiner*—Paul Gensler
*Attorney, Agent, or Firm*—Samuels, Gauthier & Stevens LLP

[57] ABSTRACT

An active inductor which consumes less direct current (DC) power and is stably biased, has a smaller number of bias pins, a higher quality factor (Q) and fewer controlling ports, than that of the prior art, is realized in metal semiconductor field effect transistor or bipolar transistor technology. The active inductor includes an inverting amplifier of a common source (common emitter) type, which inversely amplifies an input signal and outputs the amplified signal as an output signal, a non-inverting amplifier of a common gate (common base) cascode type, which non-inversely amplifies the output signal and the amplified signal as the input signal, a capacitor connected between the input signal and a reference signal, and a biasing portion for biasing the inverting amplifier and the non-inverting amplifier.

17 Claims, 5 Drawing Sheets

Frequency 0.5 to 4.42 GHz

ACTIVE INDUCTOR

BACKGROUND OF THE INVENTION

In wireless, portable telecommunication equipment, the most bulky and expensive components include a wideband monolithic voltage controlled oscillator (VCO) and a wideband tunable monolithic band pass filter (BPF). These components require high-Q passive elements, wherein Q refers to the quality factor, because the frequency characteristics of the VCO and BPF are stabilized and loss is reduced with higher Q. However, the conventional techniques of producing a spiral inductor on a semiconductor and a varactor using a field effect transistor (FET) result in components which exhibit low-Q properties due to the metallic loss and the limited doping of the substrate. Thus, considerable interest has been focused on an active inductor having both high-Q properties and tunable inductance.

The operation of the active inductor is similar in principle to that of the active gyrator, which can be realized by connecting an inverting amplifier with a non-inverting amplifier in parallel and back-to-back. The gyrator converts a parallel-connected capacitor and resistor (C//R) into a serial-connected inductor and resistor (L-R). In this example, the Q of the active inductor is degraded by the series resistance.

Conventional active inductors are disclosed in articles entitled "Lossless broadband monolithic microwave active inductors" by S. Hara et al., IEEE Trans. on MTT, Vol. 37, No. 12, p. 1979~1984, December 1989, and "Monolithic narrow-band filter using ultrahigh Q tunable active inductors" by S. Lucyszyn et al., IEEE Trans on MTT, Vol. 42, No. 12, p. 2617~2622, December 1994.

The conventional active inductor disclosed by Hara et al. is realized in two configurations: a first employing a common gate (CG) as a non-inverting amplifier and a common source (CS) cascode as an inverting amplifier, and a second employing a CG cascode as a non-inverting amplifier and a CS cascode as an inverting amplifier. The first configuration requires a large amount of current in order to obtain a predetermined inductance because the gain of the common gate is low, and has a small Q. The second configuration requires a large number of components, for example five transistors and one load resistor, and increases power consumption because of the large drop in voltage.

The conventional active inductor disclosed by Lucyszyn et al. also uses a CG having a resistor $R_g$ as a non-inverting amplifier and a CS cascode as an inverting amplifier. However, this configuration results in an increase in power consumption. Furthermore, a plurality of voltage-controlling ports are required because the voltages between the drain and source of the respective transistors should be the same, and the drain currents of the respective transistors should also be the same so as to offset a parasitic component.

Parasitic resistance, coupling and substrate loss further complicate realizing a frequency-variable circuit on a monolithic Si substrate.

SUMMARY OF THE INVENTION

To mitigate the limitations of the prior art techniques, it is an object of the present invention to provide an active inductor which can be realized by a field effect transistor (FET), consuming less direct current (DC) power, being stably biased, having a small number of bias pins and controlling ports, and having a high quality factor (high-Q).

It is another object of the present invention to provide an active inductor which can be realized by bipolar transistors, consuming less DC power, being stably biased, and having a small number of controlling ports and a high-Q factor.

The active inductor of the present invention is especially amenable for application to a wideband monolithic voltage controlled oscillator (VCO) or a wideband tunable monolithic band pass filter (BPF).

In a first preferred embodiment, the present invention comprises an active inductor comprising: an inverting amplifier of a common source type for inversely amplifying an input signal and outputting the amplified signal as an output signal; a non-inverting amplifier of a common gate cascaded type, for non-inversely amplifying the output signal and for outputting the amplified signal as the input signal; a first capacitor connected between the input signal and a amplifier.

In a second preferred embodiment the present invention comprises an active inductor comprising: an inverting amplifier of a common emitter type, for inversely amplifying an input signal and outputting the amplified signal as an output signal; a non-inverting amplifier of a common base cascaded type, for non-inversely amplifying the output signal and for outputting the amplified signal as the input signal; a first capacitor connected between the input signal and a reference signal; and a biasing unit for biasing the inverting amplifier and the non-inverting amplifier.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
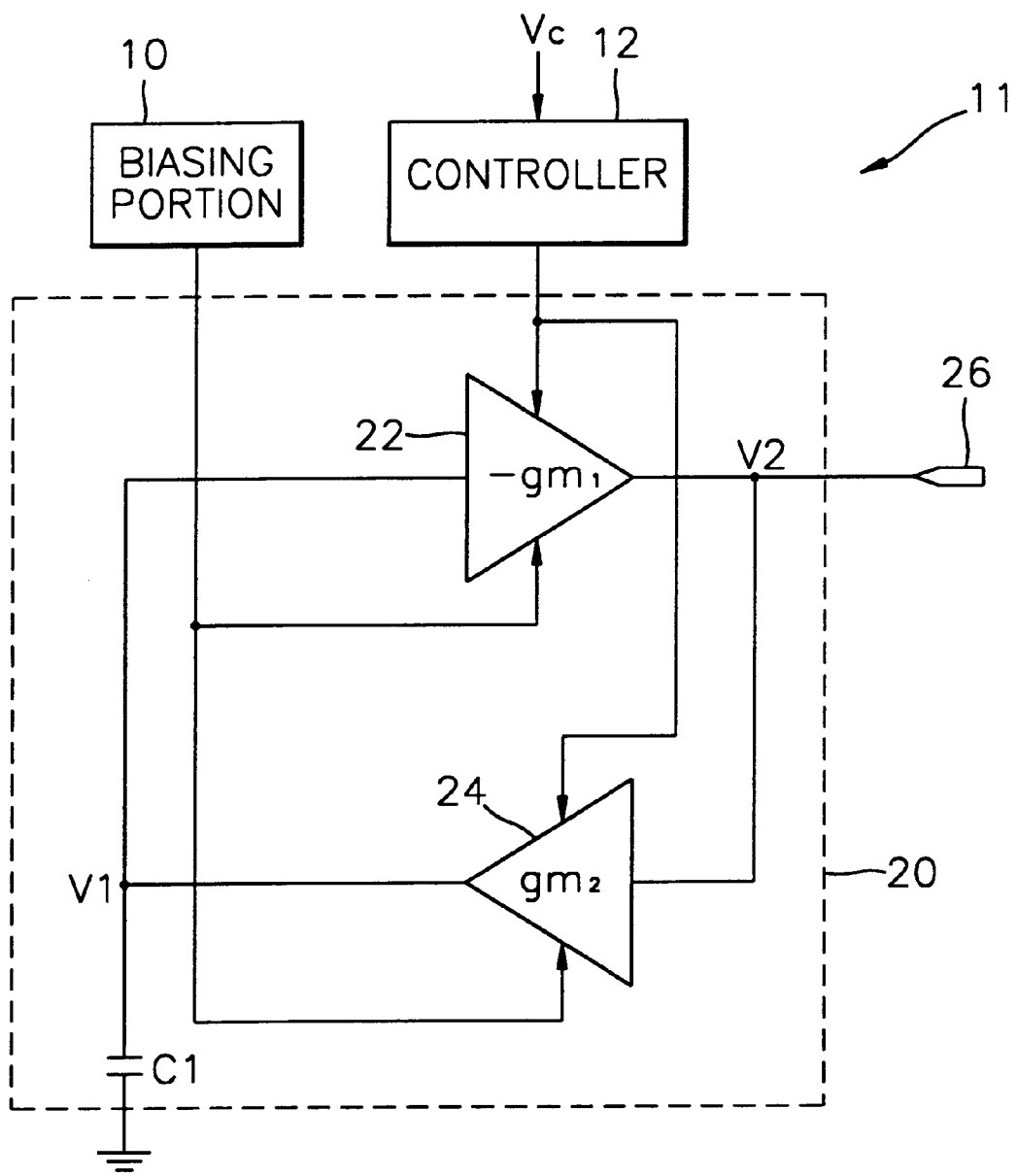
FIG. 1 is a schematic block diagram of an active inductor according to a preferred embodiment of the present invention.

As shown in FIG. 1, an active inductor 11 according to the present invention includes a biasing circuit 10, a controller 12, and a gyrator 20 having a first capacitor C1, and inverting and non-inverting amplifiers 22, 24 respectively.

As described above, the active inductor 11 according to the present invention operates according to the principles of the gyrator 20. That is, the inverting amplifier 22 of the gyrator 20 has a negative transconductance ($-gm_1$), which inverse-amplifies an input signal V1 and generates an amplified signal as output signal V2 coupled to output terminal 26. The non-inverting amplifier 24 has a positive transconductance ($gm_2$), which amplifies the output signal V2 to generate an amplified signal as input signal V1. Capacitor C1 is connected between the input signal V1 and ground. Biasing portion 10 biases the inverting amplifier 22 and the non-inverting amplifier 24. Controller 12 varies the magnitude of the transconductances—$gm_1$, $gm_2$ of the inverting and non-inverting amplifiers 22, 24 in response to an externally-applied control signal $V_c$.

The inverting amplifier 22 and the non-inverting amplifier 24 of the active inductor 11 shown in FIG. 1, are realized by two preferred embodiments in accordance with the present invention. The first embodiment employs a common source (CS) amplifier as an inverting amplifier 22 and a common gate (CG) cascode amplifier as a non-inverting amplifier 24. The second embodiment employs a common emitter amplifier as the inverting amplifier 22 and a common base cascode amplifier as the non-inverting amplifier 24.

Figure 2:
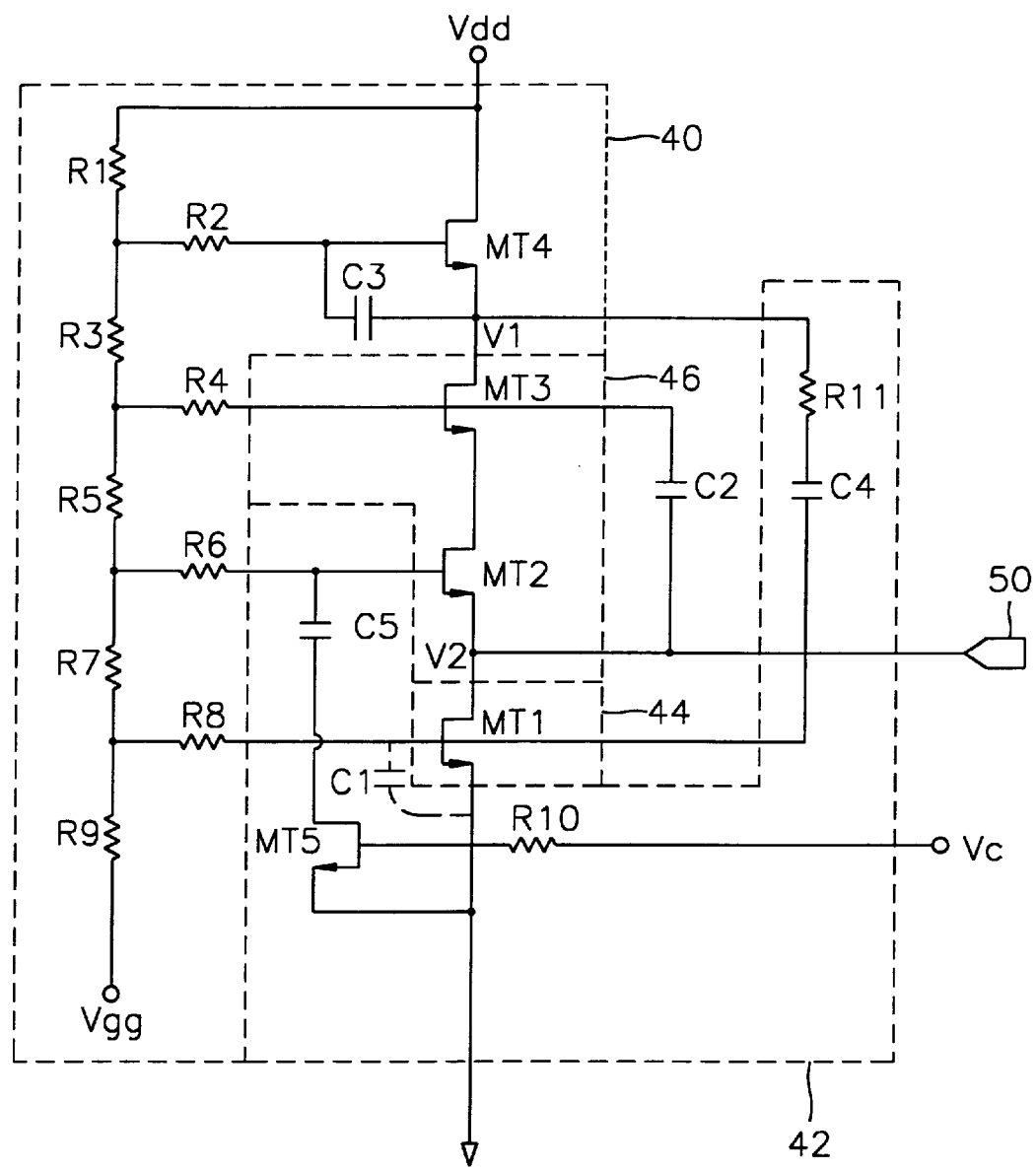
FIG. 2 is a circuit diagram of the preferred embodiment of FIG. 1, implemented with FET transistors.

FIG. 2 is a circuit diagram of the first preferred embodiment of the present invention. This embodiment includes a biasing portion 40, a controller 42, an inverting amplifier 44, a non-inverting amplifier 46 and a second capacitor C2.

In FIG. 2, a first transistor MT1, a second transistor MT2, a third transistor MT3 and the second capacitor C2 collectively form a gyrator corresponding to the gyrator 20 of FIG. 1. In detail, the first transistor MT1 has a drain and a source connected between the output signal V2 and ground, the second transistor MT2 has a drain and a source connected between a source of the third transistor MT3 and the output signal V2, the third transistor MT3 has a drain and a source connected between the input signal V1 and the drain of the second transistor MT2, and the second capacitor C2 is connected between the output signal V2 and a gate of the third transistor MT3. Parasitic capacitance $C_{gs}$ between the gate and source of the first transistor MT1 performs the function of the first capacitor C1 of FIG. 1.

Reference numeral 44 represents a common source amplifier including the first transistor MT1, corresponding to the inverting amplifier 22 of FIG. 1, and reference numeral 46 represents a common gate cascode amplifier including the second and third transistors MT2 and MT3, corresponding to the non-inverting amplifier 24 of FIG. 1.

The biasing portion 40 of FIG. 2, corresponding to the biasing portion 10 of FIG. 1, includes a fourth transistor MT4 having a drain and a source connected between a first supply power $V_{dd}$ and the input signal V1, a third capacitor C3 connected between the input signal V1 and the gate of the fourth transistor MT4, a first resistor R1 having a first end connected to the first supply power $V_{dd}$, a second resistor R2 connected between a second end of the first resistor R1 and the gate of the fourth transistor MT4, a third resistor R3 having a first end connected to the second end of the first resistor R1, a fourth resistor R4 connected between a second end of the third resistor R3 and a gate of the third transistor MT3, a fifth resistor R5 having a first end connected to the second end of the third resistor R3, a sixth resistor R6 connected between the second end of the fifth resistor R5 and a gate of the second transistor MT2, a seventh resistor R7 having a first end connected to the second end of the fifth resistor R5, an eighth resistor R8 connected between the second end of the seventh resistor R7 and the gate of the first transistor MT1, and a ninth resistor R9 connected between the second end of the seventh resistor R7 and a second supply power $V_{gg}$.

The conventional active inductors described above have a small gate capacitance, in other words, high impedance, so that a bias resistance of 6 kΩ or greater is required to access each gate. It is therefore difficult to use a resistor chain including the resistors R1, R3, R5, R7 and R9 shown in FIG. 2, and many pins are required. However, in the first preferred embodiment of the present invention, a bias signal is applied to each gate of the transistors via the resistor chain, and the resistors R2, R4, R6 and R8 are connected to each resistor of the resistor chain to reduce the number of bias pins. In the end, the first preferred embodiment of FIG. 2 can readily change the bias current and stabilize the bias at the same time, as described in *I. D. Robertson* et al., "Ultrawideband biasing of MMIC distributed amplifiers using improved active load," Electronics Letters, Vol. 27, No. 21, pp. 1907–1909 (1991).

To further improve performance, the controller 42 of FIG. 2, corresponding to the controller 12 of FIG. 1, includes a tenth resistor R10 having a first end connected to a control signal $V_c$, a fifth transistor MT5 having a gate connected to the second end of the tenth resistor R10 and having a source connected to ground, a fifth capacitor C5 connected between the gate of the second transistor MT2 and a drain of the fifth transistor MT5, a fourth capacitor C4 connected between the gate of the first transistor MT1 and a first end of an eleventh resistor R11, the second end of the eleventh resistor R11 being connected to the input signal V1. The second through fifth capacitors C2 through C5 shown in FIG. 2 serve as DC blocking capacitors for blocking DC components of the signal.

Figure 3:
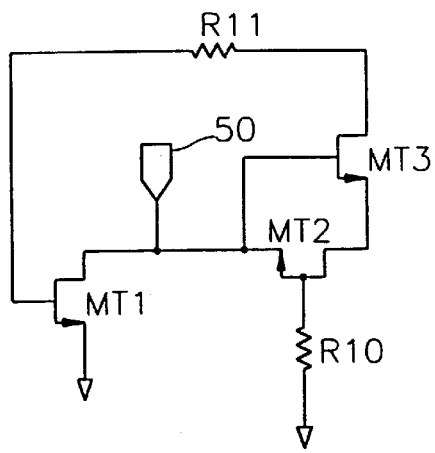
FIG. 3 is a circuit diagram of an alternating current (AC) schematic of the active inductor of FIG. 2, in accordance with the present invention.

FIG. 3 is a circuit diagram of an alternating current (AC) schematic of the first preferred embodiment shown in FIG. 2, including the eleventh resistor R11 and the first, second and third transistors MT1, MT2 and MT3. As can be seen in FIG. 3, in the AC schematic of the active inductor, the gate of the first transistor MT1 is connected to the drain of the third transistor MT3 by the resistor R11, and the drain of the first transistor MT1 and the source of the second transistor MT2 are connected to the gate of the third transistor MT3.

The CG cascode (non-inverting) amplifier 46 of FIG. 2 has a high transfer characteristic $Y_{21}$, a high output impedance $1/y_{22}$ and a low inverse transfer characteristic $y_{12}$, as compared with a standard CG amplifier. From the following admittance matrix formula derived from the circuit of FIG. 3, it is understood that the CG cascaded amplifier 46 successfully performs the role of the non-inverting amplifier of the gyrator:

$$Y_{CGcascode} = \begin{bmatrix} y_{11} & y_{12} \\ y_{21} & y_{22} \end{bmatrix} = \begin{bmatrix} g_m - g_o & \dfrac{sC_{gs} + g_o}{\mu} \\ g_m + g_o & \dfrac{sC_{gs} + g_o}{\mu} \end{bmatrix} \qquad (1)$$

where $\mu$ represents $g_m/g_o$, and where $g_o$ and $g_m$ represent output conductance and output transconductance, respectively, at an output port 50.

The CS (inverting) amplifier 44 of FIG. 2 has a narrow bandwidth and a small gain compared to the CS cascode amplifier of the prior art. When a CS cascode amplifier is used as the inverting amplifier 44, feedback increases excessively, and therefore oscillation is more likely to occur. Accordingly, the present invention preferably employs a CS amplifier as the inverting amplifier, which can simultaneously reduce DC voltage drop and prevent or mitigate oscillation.

Inductance in the first preferred embodiment of FIG. 2 is controlled by resistors R10 and R11 of the controller 42 and a higher Q is obtained. That is, inductance loss due to parasitic resistance is compensated by resistors R10 and R11. Here, the resistor R10 may optionally be realized by a floating or cold FET.

The operation of the first preferred embodiment of the active inductor shown in FIG. 2 will now be described by applying the following conditions.

Figure 4:
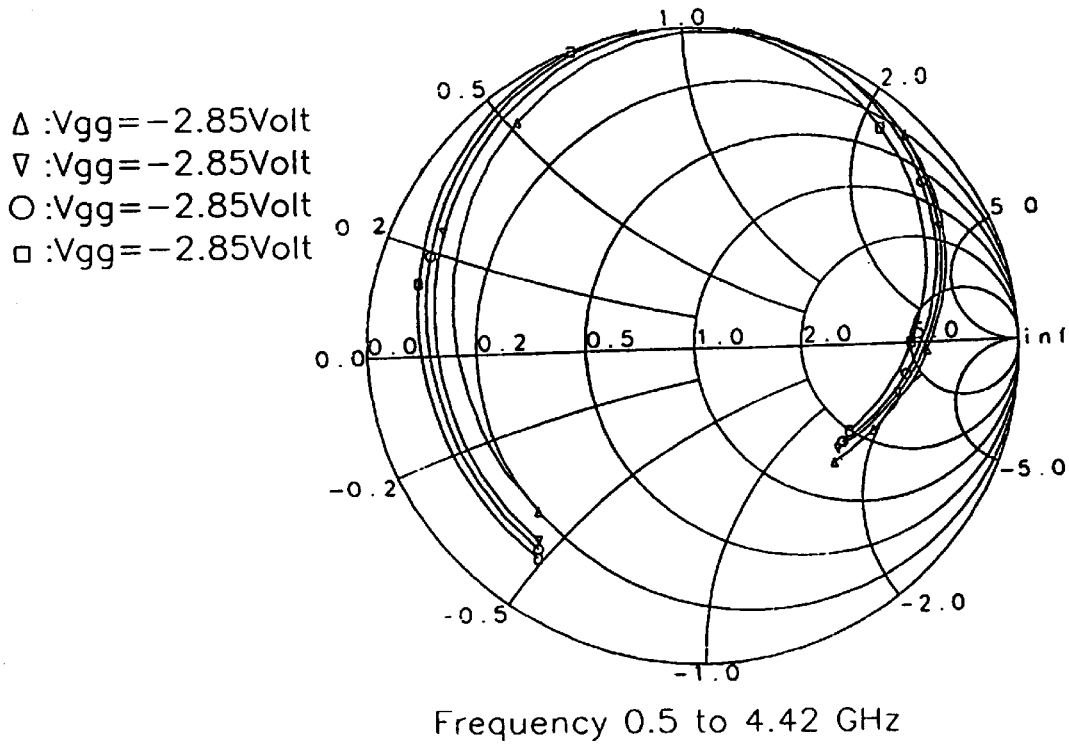
FIG. 4 is a Smith chart showing impedance variation of the active inductor of FIG. 2.

FIG. 4 is a Smith chart illustrating impedance variation of the first preferred embodiment of FIG. 2. Here, operating frequency varies over a range between 0.5 and 4.42 GHz.

Assumptions are made as follows: the active inductor is fabricated on gallium arsenic (GaAs), resistors R1, R3, R5, R7 and R9 comprise 3.75 kΩ, 4.05 kΩ, 3.00 kΩ, 3.00 kΩ and 2.55 kΩ, respectively, and resistors R2, R4, R6 and F8 each comprise 1.5 kΩ, capacitors C2–C5 each comprise 10 pF, resistors R10 and R11 comprise 6 kΩ and 650Ω, respectively, and aspect ratios of the first through fifth transistors MT1 through MT5 comprise 200 μm, 200 μm, 200 μm, 50 μm and 200 μm, respectively.

In Table I, a first set of conditions fixes the first supply voltage $V_{dd}$ at 8V, while varying the second supply voltage $V_{gg}$ and the control signal $V_c$. A second set of conditions fixes the control voltage $V_c$ and varies $V_{dd}$ and $V_{gg}$. For each set of conditions, DC power consumption ($P_{dc}$), DC power consumption ratio, ($P_{dc}\%$) and output inductance (L) at the output port 50 of FIG. 2 are calculated.

TABLE 1

| conditions | [Volt] | [Volt] | Pdc[mW] | Pdc ratio[%] | L[nH] |
|---|---|---|---|---|---|
| Vgg & Vc | −2.85 | −1.3 | 47.9 | 22.9 | 3.8 |
| (Vdd = 8V) | −2.75 | −1.0 | 58.9 | 28.2 | 2.8 |
|  | −2.70 | −0.8 | 62.7 | 30.0 | 2.5 |
|  | −2.63 | 0.5 | 72.2 | 34.5 | 2.2 |
| Vdd & Vgg | 8 | −2.68 | 66.0 | 31.6 | 2.4 |
| (Vc = −0.5V) | 7 | −2.45 | 59.7 | 28.6 | 2.3 |
|  | 6 | −2.20 | 54.7 | 26.2 | 2.1 |
|  | 5 | −1.25 | 57.3 | 27.4 | 1.9 |

As compared to the DC power consumed by the conventional active inductor disclosed by S. Lucyszyn et al., namely 209 mW, the power consumption by the first preferred embodiment of the present invention is very low as can be seen in Table 1. While maintaining low power, inductance is variable over a range between 1.9 nH and 3.8 nH, and high-Q is achieved as demonstrated in the Smith chart of FIG. 4.

The first preferred embodiment of the invention is amenable to application in wideband monolithic VCO and wide tunable monolithic BPF. In an experimental embodiment, applied as a colpitts voltage control oscillator, the oscillation frequency varied between 2.1 GHz and 3.0 GHz resulting in a 35% tuning ratio. In the case of application as a wide tunable BPF having a wide tunable range, the center frequency of the BPF was varied by changing the control signal $V_c$, and the BPF demonstrated good insertion loss in the pass band and a low level out of the pass band. For example, when applied to a dual-resonator filter having the same structure as a basic topology of a triple-resonator filter (not shown) disclosed in the conventional active inductor of S. Lucyszyn et al., the center frequency varied over a range between 2.64 and 3.03 GHz by changing the control signal $V_c$. The tuning ratio was 13.8%, and DC power consumption was 115 mV.

The first through fifth transistors MT1–MT5 of the first preferred embodiment of the present invention adopt metal semiconductor field effect transistor (MESFET) technology as shown in FIG. 2. However, metal oxide semiconductor field effect transistor (MOSFET) technology may also be employed.

Figure 5:
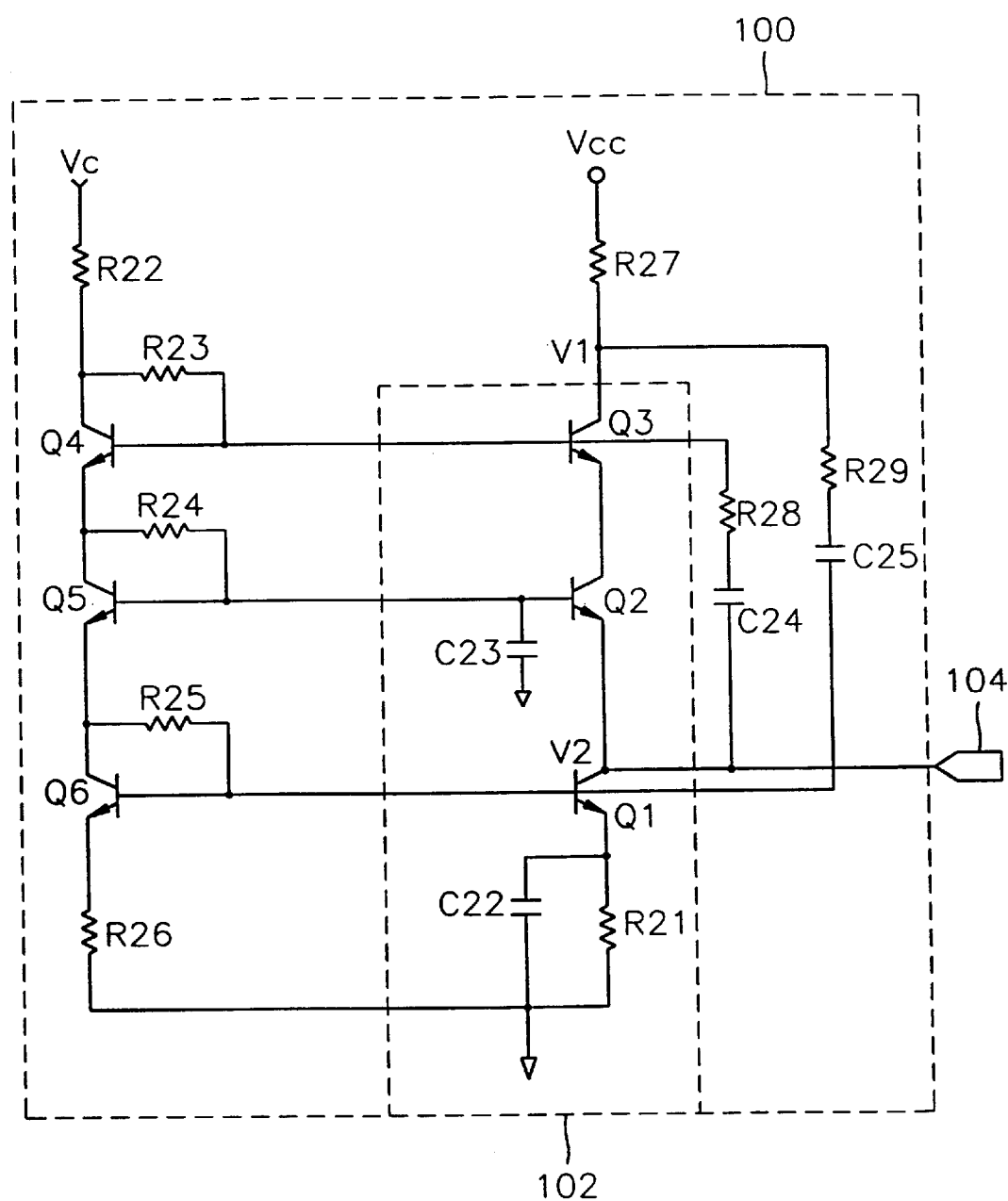
FIG. 5 is a circuit diagram of the preferred embodiment of FIG. 1, implemented with bipolar transistors.

FIG. 5 is a circuit diagram of a second preferred embodiment of the present invention, comprising a biasing & controlling unit 100 and a gyrator 102.

The biasing & controlling unit 100 of FIG. 5 operates as the biasing portion 10 and the controller 12 of the active inductor 11 of FIG. 1. The gyrator 102 corresponds to the gyrator 20 of FIG. 1.

The gyrator 102 includes a transistor Q1, a resistor R21, a capacitor C22, a transistor Q2, a transistor Q3 and a capacitor C23. In detail, the transistor Q1 has a collector and an emitter, being connected between an output signal V2 and one end of the resistor R21, the resistor R21 and capacitor 22 being coupled, in parallel, between the emitter of the transistor Q1 and ground. The transistor Q2 has a collector connected to an emitter of the transistor Q3 and an emitter at the output signal V2, the transistor Q3 has a collector connected to input signal V1 and an emitter connected to the collector of transistor Q2. Capacitor C23 is connected between a base of transistor Q2 and ground. Here, a parasitic capacitor $C_{be}$ between a base and the emitter of the first transistor Q1 provides the function of the first capacitor C1 of FIG. 1.

The biasing & controlling unit 100 supplies a bias signal to each base of the first through third transistors Q1, Q2 and Q3 using a current mirror, and controls the amount of bias signal in response to an applied control signal Vc.

To perform this function, the biasing and controlling unit 100 includes resistors R22 through R29, transistors Q4, Q5 and Q6, and capacitors C24 and C25. In detail, the resistor R22 has one end connected to a control signal $V_c$, the resistor R23 is connected to the other end of the resistor R22 and a base of the transistor Q3, and the resistor R24 has one end connected to the base of the transistor Q2. The transistor Q4 has a base connected to the base of the transistor Q3, and a collector and an emitter which are connected between the other end of the resistor R23 and the other end of the resistor R24. The resistor R25 has one end connected to the base of the transistor Q1. The transistor Q5 has a base connected to the base of the transistor Q2, and a collector and an emitter which are connected between the other end of the resistor R24 and the other end of the resistor R25. Resistor R26 has one end connected to the ground. The transistor Q6 has a base connected to the base of the transistor Q1, and a collector and an emitter which are connected to the other end of the resistor R25 and the other end of the resistor R26. Resistor R27 is connected between a supply voltage $V_{cc}$ and the input signal V1. Capacitor C24 and resistor R28 are serially connected between the output signal V2 and the base of transistor Q3. Capacitor C25 and resistor R29 are serially connected between the base of the transistor Q1 and the input signal V1.

Capacitors C22, C23, C24 and C25 serve as DC blocking capacitors for blocking DC components of the signal.

The following admittance matrix formula (2) with respect to the common base cascode amplifier of the second preferred embodiment of FIG. 5 is derived from a general AC schematic:

$$Y_{CBcascode} = \begin{bmatrix} y_{11} & y_{12} \\ y_{21} & y_{22} \end{bmatrix} = \begin{bmatrix} g_m - g_o & \dfrac{sC_{be} + g_o}{\mu} \\ g_m + g_o & \dfrac{sC_{be} + g_o}{\mu} \end{bmatrix} \quad (2)$$

where $\mu$ represents $g_m/g_o$, and $g_o$ and $g_m$ represent output conductance and output transconductance at an output port 104, respectively.

As can be known from the formula (2), the structure of the common base cascode amplifier has a high output impedance and a low inverse transfer impedance, so that it is suitable for use as a non-inverting amplifier of the gyrator 102.

The second preferred embodiment (FIG. 5) of the present invention fabricated in silicon (Si), has a µ factor as high as 10 times that of the first preferred embodiment (FIG. 2) made of GaAs, and thus can be operated at lower current levels. Furthermore, the second preferred embodiment of FIG. 5 employs a Si bipolar transistor having a saturation voltage which is far lower than that of a GaAs MESFET. Thus, the second preferred embodiment can operate at a favorably lower voltage than the first preferred embodiment.

As stated above, the conventional active inductors of the prior art require a plurality of control ports to control the voltage to each transistor. However, because the second preferred embodiment is suitable as a current-controlled device, the inductance thereof can be varied easily by the transistors which form a current mirror. The biasing & controlling unit 100, the emitter resistor R26, and resistors R23, R24, R25, inserted between the collector and base of the corresponding transistors Q4, Q5 or Q6, form the current mirror, such that the inductance and Q of the component are controlled by a single control port $V_c$ while, at the same time, minimizing parasitic load. The amount of feedback and inductance levels are controlled by resistors R28 and R29. For controlling the resistance of resistor R29, a floating NMOS may be used.

Figure 6:
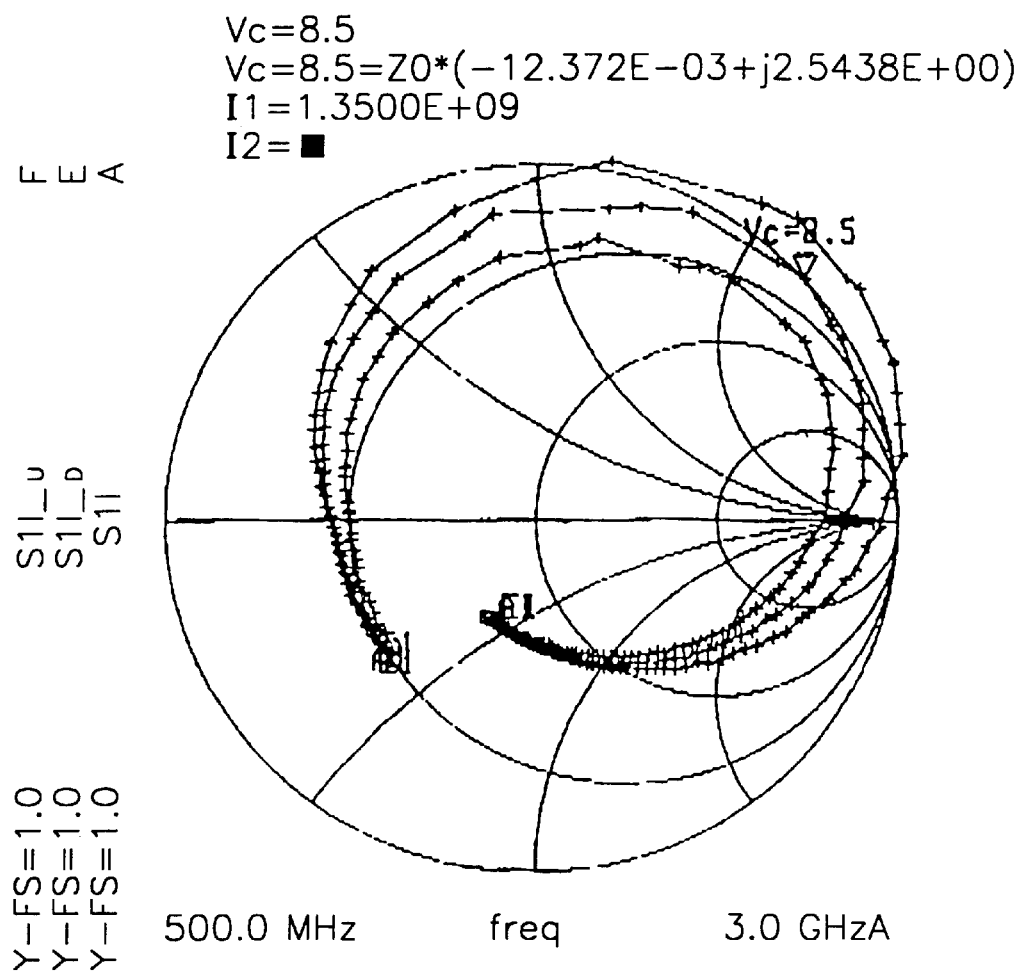
FIG. 6 is a Smith chart showing variations of impedance and serial resistance of the active inductor of FIG. 5.

FIG. 6 is a Smith chart showing variations of inductance and serial resistance of the second preferred embodiment of FIG. 5.

In a preferred embodiment, for the data collected in the Smith Chart of FIG. 6, it is assumed that resistors R22, R23, R24, R25 and R27 comprise 2 kΩ, resistors R21 and R26 comprise 1 kΩ, and resistors R28 and R29 comprise 50Ω and 240Ω, respectively. As the level of the control signal $V_c$ changes, inductance and serial resistance are shown as in FIG. 6, and there is no loss of inductance at a narrow band near 13 GHz. The second preferred embodiment consumes a smaller amount of DC power as compared to that of the first preferred embodiment.

The second preferred embodiment of FIG. 5 is amenable to use as a wideband monolithic voltage control oscillator and a wide tunable monolithic BPF.

As described above, the active inductor according to the present invention can vary inductance over a wider range and have a higher Q than those of the conventional active inductors, while the level of power consumption is approximately ⅓ of that of the conventional inductors. Also, the active inductor of the invention can be stably biased, with a small number of bias pins. In addition, the active inductor is operable in a wide tunable monolithic voltage control oscillator having the tuning ratio of 35% and a monolithic BPF having the wide tuning ratio of 14%.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. An active inductor having an output terminal comprising:

a common-source inverting amplifier for inversely amplifying an input signal applied to an input node and for providing an inversely-amplified output signal at an output node, the inverting amplifier having a parasitic capacitive effect between the input node and a reference signal; the output node being directly coupled to the output terminal of the active inductor;

a common-gate cascode non-inverting amplifier for non-inversely amplifying the output signal applied to the output node and for providing a non-inversely amplified input signal at the input node; and a biasing unit for biasing the inverting amplifier and the non-inverting amplifier.

2. The active inductor of claim 1, wherein the inverting and non-inverting amplifiers comprise:

a first transistor having a drain and a source which are coupled between the output node and the reference signal;

a second transistor having a drain and a source which are coupled between a first node and the output node;

a third transistor having a drain and a source which are connected between the input node and the first node; and a second capacitor connected between the output node and a gate of the third transistor, and wherein the biasing unit supplies a bias signal to each gate of the first, second and third transistors.

3. The active inductor of claim 2, wherein the biasing unit comprises:

a fourth transistor having a drain and a source which are connected between a first supply voltage and the input node;

a third capacitor connected between the input node and a gate of the fourth transistor;

a first resistor having one end connected to the first supply voltage;

a second resistor connected between the other end of the first resistor and a gate of the fourth transistor;

a third resistor having one end connected to the other end of the first resistor;

a fourth resistor connected between the other end of the third resistor and the gate of the third transistor;

a fifth resistor having one end connected to the other end of the third resistor;

a sixth resistor connected between the other end of the fifth resistor and the gate of the second resistor;

a seventh resistor having one end connected to the other end of the fifth resistor;

an eighth resistor connected between the other end of the seventh resistor and the gate of the first transistor; and a ninth resistor connected between the other end of the seventh resistor and a gate bias voltage.

4. The active inductor of claim 2 further comprising a control unit for varying the transconductances of the inverting amplifier and the non-inverting amplifier in response to an applied control signal, wherein the control unit comprises:

a tenth resistor having one end connected to the control signal;

a fifth transistor having a gate connected to the other end of the tenth resistor, and having a drain and a source which are connected between a second node and the reference signal;

a fifth capacitor connected between the gate of the second transistor and the second node;

a fourth capacitor connected between the gate of the first transistor and a third node; and an eleventh resistor connected between the third node and the input node.

5. The active inductor of claim 1, further comprising a control unit for varying transconductances of the inverting amplifier and the non-inverting amplifier in response to an applied control signal.

6. The active inductor of claim 1, wherein the amplifiers are formed of semiconductor transistors selected from the list of transistor technologies consisting of metal semiconductor field effect transistors (MESFET), and metal oxide semiconductor field effect transistors (MOSFET).

7. The active inductor of claim 1 wherein the inverting amplifier comprises:
a first transistor having a drain and source which are coupled between the output node and a reference signal; and wherein the non-inverting amplifier comprises
a second transistor having a drain and source which are connected between a first node and the output node; and
a third transistor having a drain and source which are coupled between the input node and the first node.

8. An active inductor having an output terminal comprising:
a common-emitter inverting amplifier for inversely amplifying an input signal applied to an input node and for providing an inversely-amplified output signal at an output node, the inverting amplifier having a parasitic capacitive effect between the input node and a reference signal, the output node being directly coupled to the output terminal of the active inductor;
a common-base cascode non-inverting amplifier for non-inversely amplifying the output signal applied to the output node and for providing a non-inversely amplified input signal at the input node; and
a biasing unit for biasing the inverting amplifier and the non-inverting amplifier.

9. The active inductor of claim 8, wherein the inverting and non-inverting amplifiers comprise:
a first transistor having a collector and an emitter which are connected between the output node and a first node;
a first resistor connected between the first node and the reference signal;
a second capacitor connected in parallel with the first resistor between the first node and the reference signal;
a second transistor having a collector and an emitter which are connected between a second node and the output node;
a third transistor having a collector and an emitter which are connected between the input node and the second node; and
a third capacitor connected between a base of the second transistor and the reference signal, wherein the biasing unit supplies a bias signal to each base of the first, second and third transistors.

10. The active inductor of claim 9, further comprising a control unit for controlling the level of bias signal in response to an applied control signal.

11. The active inductor of claim 10, wherein the biasing unit and the control unit comprise:
a second resistor having one end connected to the control signal;
a third resistor connected between the other end of the second resistor and the base of the third transistor;
a fourth resistor having one end connected to the base of the second transistor;
a fourth transistor having a base connected to the base of the third transistor, and having a collector and an emitter which are connected between the other end of the second resistor and the other end of the fourth resistor;
a fifth resistor having one end connected to the base of the first transistor;
a fifth transistor having a base connected to the base of the second transistor, and having a collector and an emitter which are connected between the other end of the fourth resistor and the other end of the fifth resistor;
a sixth resistor having one end connected to the reference signal;
a sixth transistor having a base connected to the base of the first transistor, and a collector and an emitter which are connected between the other end of the fifth resistor and the other end of the sixth resistor;
a seventh resistor connected between a supply voltage and the input signal;
a fourth capacitor connected between the output signal and a third node;
an eighth resistor connected between the third node and the base of the third transistor;
a fifth capacitor connected between the base of the first transistor and a fourth node; and
a ninth resistor connected between the fourth node and the input signal.

12. The active inductor of claim 11 wherein the control signal comprises the supply voltage.

13. The active inductor of claim 8, wherein the amplifiers are formed of bipolar junction transistors (BJT).

14. An active inductor comprising:
a common-source inverting amplifier for inversely amplifying an input signal applied to an input node and for providing an inversely-amplified output signal at an output node;
a common-gate cascode non-inverting amplifier for non-inversely amplifying the output signal applied to the output node and for providing a non-inversely amplified input signal at the input node;
a first parasitic capacitive effect between the input node and a reference signal: and
a biasing unit for biasing the inverting amplifier and the non-inverting amplifier;
wherein the inverting and non-inverting amplifiers comprise:
a first transistor having a drain and a source which are coupled between the output node and the reference signal;
a second transistor having a drain and a source which are coupled between a first node and the output node;
a third transistor having a drain and a source which are connected between the input node and the first node; and
a second capacitor connected between the output node and a gate of the third transistor; wherein the biasing unit supplies a bias signal to each gate of the first, second and third transistors; and
wherein the biasing unit comprises:
a fourth transistor having a drain and a source which are connected between a first supply voltage and the input node;
a third capacitor connected between the input node and a gate of the fourth transistor;
a first resistor having one end connected to the first supply voltage;
a second resistor connected between the other end of the first resistor and a gate of the fourth transistor;
a third resistor having one end connected to the other end of the first resistor;

a fourth resistor connected between the other end of the third resistor and the gate of the third transistor;

a fifth resistor having one end connected to the other end of the third resistor;

a sixth resistor connected between the other end of the fifth resistor and the gate of the second resistor;

a seventh resistor having one end connected to the other end of the fifth resistor;

an eighth resistor connected between the other end of the seventh resistor and the gate of the first transistor; and a ninth resistor connected between the other end of the seventh resistor and a gate bias voltage.

15. An active inductor comprising:

a common-source inverting amplifier for inversely amplifying an input signal applied to an input node and for providing an inversely-amplified output signal at an output node; the common-source inverting amplifier comprising a first transistor having a drain and a source which are coupled between the output node and a reference signal;

a common gate cascode non-inverting amplifier for non-inversely amplifying the output signal applied to the output node and for providing a non-inversely amplified input signal at the input node; the common-gate cascode non-inverting amplifier comprising:
  a second transistor having a drain and a source which are coupled between a first node and the output node; and
  a third transistor having a drain and a source which are coupled between the input node and the first node, a second capacitor being coupled between the output node and a gate of the third transistor;

a first parasitic capacitive effect between the input node and a reference signal;

a biasing unit for biasing the first, second, and third transistors; and a control unit for varying transconductances of the inverting amplifier and the non-inverting amplifier in response to an applied control signal, the control unit comprising:
  a tenth resistor having one end connected to the control signal;
  a fifth transistor having a gate connected to the other end of the tenth resistor, and having a drain and a source which are connected between a second node and the reference signal;
  a fifth capacitor connected between the gate of the second transistor and the second node;
  a fourth capacitor connected between the gate of the first transistor and a third node; and
  an eleventh resistor connected between the third node and the input signal.

16. An active inductor comprising:

a common-emitter inverting amplifier for inversely amplifying an input signal applied to an input node and for providing an inversely-amplified output signal at an output node;

a common base cascode non-inverting amplifier for non-inversely amplifying the output signal applied to the output node and for providing a non-inversely amplified input signal at the input node;

a first parasitic capacitive effect between the input node and a reference signal;

a biasing unit for biasing the inverting amplifier and the non-inverting amplifier; and a control unit for controlling the level of bias signal in response to an applied control signal;

wherein the inverting and non-inverting amplifiers comprise:
  a first transistor having a collector and an emitter which are connected between the output node and a first node;
  a first resistor connected between the first node and the reference signal;
  a second capacitor connected in parallel with the first resistor between the first node and the reference signal;
  a second transistor having a collector and an emitter which are connected between a second node and the output node;
  a third transistor having a collector and an emitter which are connected between the input node and the second node; and
  a third capacitor connected between a base of the second transistor and the reference signal, wherein the biasing unit supplies a bias signal to each base of the first, second and third transistors; and wherein the biasing unit and control unit comprise:
  a second resistor having one end connected to the control signal;
  a third resistor connected between the other end of the second resistor and the base of the third transistor;
  a fourth resistor having one end connected to the base of the second transistor;
  a fourth transistor having a base connected to the base of the third transistor, and having a collector and an emitter which are connected between the other end of the second resistor and the other end of the fourth resistor;
  a fifth resistor having one end connected to the base of the first transistor;
  a fifth transistor having a base connected to the base of the second transistor, and having a collector and an emitter which are connected between the other end of the fourth resistor and the other end of the fifth resistor;
  a sixth resistor having one end connected to the reference signal;
  a sixth transistor having a base connected to the base of the first transistor, and a collector and an emitter which are connected between the other end of the fifth resistor and the other end of the sixth resistor;
  a seventh resistor connected between a supply voltage and the input signal;
  a fourth capacitor connected between the output signal and a third node;
  an eighth resistor connected between the third node and the base of the third transistor;
  a fifth capacitor connected between the base of the first transistor and a fourth node; and
  a ninth resistor connected between the fourth node and the input signal.

17. The active inductor of claim 16 wherein the control signal comprises the supply voltage.

* * * * *